United States Patent
Sioma

(10) Patent No.: US 8,072,223 B1
(45) Date of Patent: Dec. 6, 2011

(54) MONITORING CIRCUIT FOR DETERMINING IF AN ELECTRIC ELEMENT HAS FAILED BEFORE THE ELECTRIC ELEMENT IS POWERED

(76) Inventor: Edward M. Sioma, Levittown, PA (US)

( * ) Notice: Subject to any disclaimer, the term of this patent is extended or adjusted under 35 U.S.C. 154(b) by 0 days.

(21) Appl. No.: 13/194,959

(22) Filed: Jul. 31, 2011

(51) Int. Cl.
*G01R 31/00* (2006.01)
*H01J 7/42* (2006.01)

(52) U.S. Cl. .................. 324/414; 324/403; 315/129

(58) Field of Classification Search .............. 324/403, 324/414, 555, 500; 398/10, 16, 17; 315/120, 315/129, 134, 224, 209 R
See application file for complete search history.

(56) References Cited

U.S. PATENT DOCUMENTS

| | | | |
|---|---|---|---|
| 4,348,613 A | | 9/1982 | Hormel et al. |
| 5,185,736 A | * | 2/1993 | Tyrrell et al. ................. 370/358 |
| 6,452,340 B1 | * | 9/2002 | Morrissey et al. ............ 315/151 |
| 6,963,170 B2 | | 11/2005 | Higgins |
| 7,332,867 B2 | * | 2/2008 | Cho .......................... 315/209 R |

* cited by examiner

*Primary Examiner* — Hoai-An D Nguyen
(74) *Attorney, Agent, or Firm* — LaMorte & Associates

(57) ABSTRACT

A circuit for monitoring the functionality of an electrical element. A primary power supply provides direct current to the electrical element at a current sufficient for the electrical element to operate. A Schottky diode is disposed between the primary power supply and the electrical element, wherein the electrical element draws its operational current through the Schottky diode when in operation. A reverse bias power supply is provided. An opto-isolator is disposed between the reverse bias power supply and the electrical element. The electrical element draws a secondary current from the reverse bias power supply through the opto-isolator. The opto-isolator creates an output signal that is indicative of the secondary current. The output signal is used to control a remote failure indicator. When the electrical element fails, the current flowing through the opto-isolator stops. This triggers the failure indicator and informs a user as to the failed status.

19 Claims, 1 Drawing Sheet

MONITORING CIRCUIT FOR DETERMINING IF AN ELECTRIC ELEMENT HAS FAILED BEFORE THE ELECTRIC ELEMENT IS POWERED

BACKGROUND OF THE INVENTION

1. Field of the Invention

In general, the present invention relates to systems and methods that monitor the functionality of electric elements, such as incandescent bulbs and light emitting diodes. More particularly, the present invention relates to systems and methods that are capable of monitoring the failure of an electrical element even if that electrical element were to fail when powered off.

2. Prior Art Description

Many machines, such as automobiles, appliances, industrial equipment, and the like include small electrical elements such as lights. Some of the lights, especially the lights used to illuminate control panels, are important in the proper and safe operation of the machine. Take, for example, an automobile. The automobile has many obvious lights such as the headlights and brake lights. However, the automobile also has numerous safety system lights that the vehicle owner may never see. The safety system lights include the check engine light, the low oil light, and numerous other safety system lights that indicate that some system of the automobile is in danger of failing. Should one of the safety system lights fail, the driver of the automobile may have no indication that some system has failed. This may result in catastrophic failure. For example, if the low oil light in an automobile fails and the automobile has an oil leak, the driver may be unaware of the condition until the engine seizes for lack of oil. Likewise, consider a light failure in an airplane that prevents a pilot from detecting a potential engine stopping condition.

In the prior art, there are many circuits that have been designed to indicate to a person that a specific electric element has failed. Many of these circuits use complex transistor configurations to monitor the flow of current through a light. Accordingly, the cost of such monitoring circuits is significant and the economics limits the use of such circuits. Such complex prior art circuits are exemplified by U.S. Pat. No. 4,348,613 to Hormel, entitled, Lamp Failure Indicator Circuit.

Other complex prior art circuits optically detect whether or not a lamp emits any light when activated. Such prior art circuits are exemplified by U.S. Pat. No. 6,963,170 to Higgins, entitled Lamp Monitor And Lamp. These light detector circuits also have significant costs that limit their application.

A problem associated with both types of prior art monitoring systems is that a broken electrical element, such as a safety light, cannot be detected until that light is powered on and fails to light. In many machines, electrical elements, such as lights, fail when the electrical element is powered off. Failure of a light may be due to corrosion, vibrational fatigue, water damage, or even terrorist sabotage. If such a failure occurs, the operator of the machinery has no warning of the failure until it is too late. For example, suppose the reverse lights on a tractor-trailer fail due to vibrational damage while the truck is in transit. The driver of the truck would have no way of knowing that the lights have failed until the driver puts the truck into reverse. At that point, the driver may be committed to backing the truck in reverse and now has to do so with no light.

A need therefore exists for a simple, low cost circuit that can warn a person about the failure of an electrical element at the moment of the failure, regardless of whether the electrical element is powered on or off. This need is met by the present invention as described and claimed below.

SUMMARY OF THE INVENTION

The present invention is a circuit for monitoring the functionality of an electrical element, such as a light. The circuit includes a primary power supply that provides direct current to the electrical element at a current flow sufficient for the electrical element to operate. A Schottky diode is disposed between the primary power supply and the electrical element, wherein the electrical element draws its operational current through the Schottky diode when in operation.

A reverse bias power supply is provided. An opto-isolator is disposed between the reverse bias power supply and the electrical element. The electrical element draws a secondary current from the reverse bias power supply through the opto-isolator. The secondary current is preferably one percent or less than the primary current. Furthermore, the opto-isolator creates an output signal that is indicative of the secondary current. The output signal is used to control a remote failure indicator. When the electrical element fails, the current flowing through the opto-isolator stops. This is true regardless of whether the electrical element is on or off. Once the current flow through the opto-isolator stops, the voltage of the output signal drops to zero. This triggers the failure indicator and informs a user as to the failed status of the electrical element at the very moment of failure.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE DRAWINGS

Figure 1:
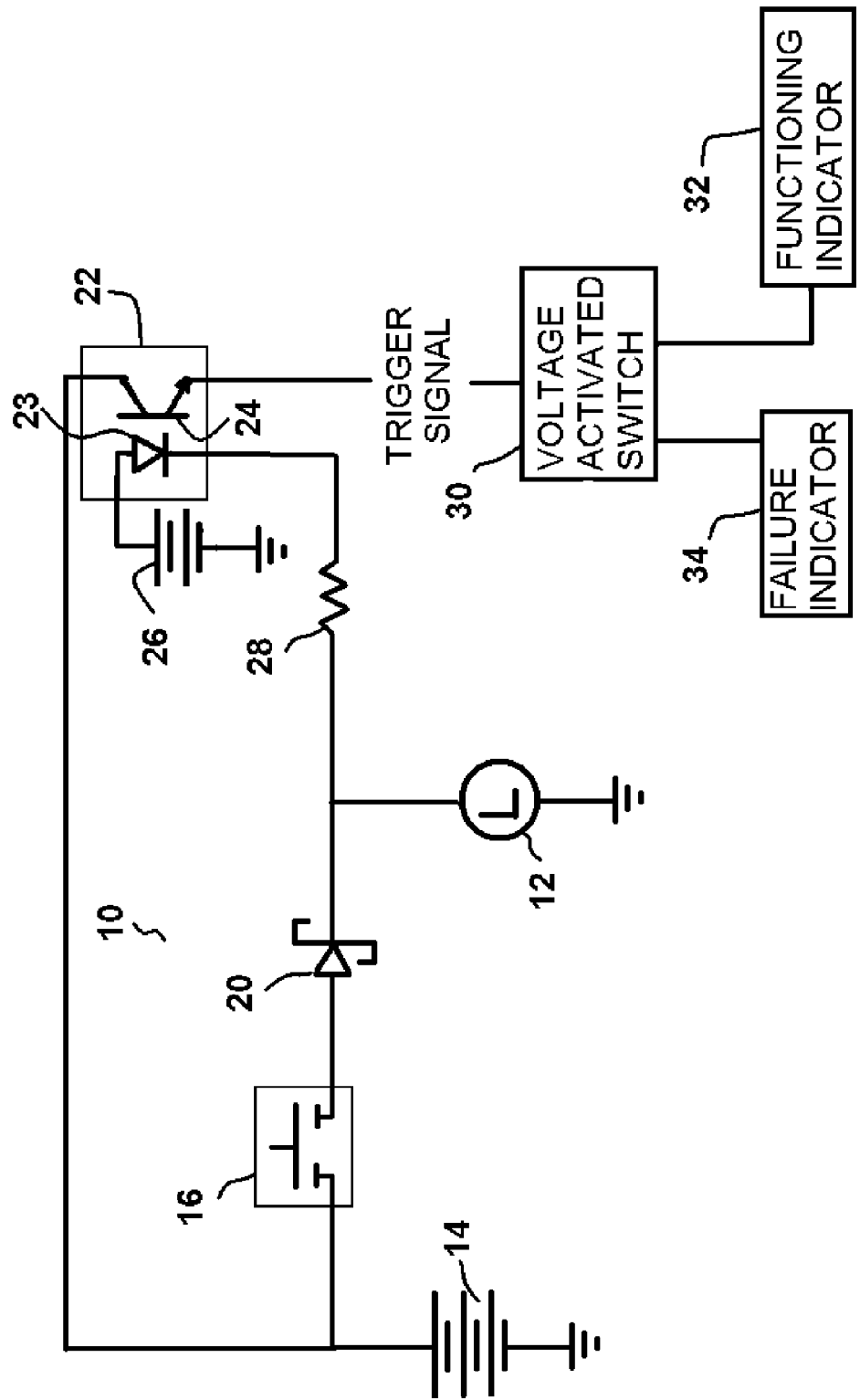
FIG. 1 is a circuit diagram of an exemplary embodiment of the present invention monitoring circuit.

Although the present invention monitoring circuit can be used in a wide variety of applications, only one exemplary embodiment of the invention is illustrated. The exemplary embodiment is used to monitor and detect when a light source fails, such as an incandescent bulb or light emitting diode. However, the present invention monitoring circuit can monitor any device, such as temperature sensors, and/or gas sensors, through which current passes when in operation. The illustrated embodiment uses a simple light source to show a simple circuit and to present one of the best modes contemplated for the invention. The illustrated embodiment, however, is merely exemplary and should not be considered a limitation when interpreting the scope of the appended claims.

Referring to FIG. 1, the exemplary embodiment of the monitor circuit 10 is shown. In the exemplary embodiment, the purpose of the monitoring circuit 10 is to detect when an electronic element fails. For the exemplary embodiment, it is being assumed that the electric element is a light source 12 and the light source 12 is part of a motor vehicle, such as a car or truck. Accordingly, the light source 12 is powered by a battery 14 that supplies twelve volts of direct current. Furthermore, the light source 12 is controlled by a switch 16. The switch 16 may be a manual switch, such as the headlight switch or the brake light switch. Alternatively, the switch 16 may be an automatic switch, such as the check engine switch, that is part of the vehicle's safety systems.

A Schottky diode 20 is placed in series with the battery 14, switch 16 and light source 12. The Schottky diode 20 is positioned in series with the light source 12 so that any current flowing to the light source 12 from the battery 14 must pass through the Schottky diode 20. For the monitoring circuit 10 shown and the typical light sources used in vehicles, it can be reasonably assumed that when the switch 16 is closed, a current in the order of 0.3 amps to 3.0 amps will pass through the Schottky diode 20. The voltage loss across the Schottky diode 20 is negligible, being in the order of 0.3 volts from a twelve-volt power source.

An opto-isolator 22 is provided. The opto-isolator 22 is an inexpensive phototransistor opto-isolator, such as a type 4N25 opto-isolator. Accordingly, the opto-isolator 22 contains a light emitting element 23 and a phototransistor element 24. The light emitting element 23 within the opto-isolator 22 is powered by a reverse bias power supply 26. The voltage of the reverse bias power supply 26 is greater than that of the vehicle battery 14, having a preferred voltage of approximately eighteen volts. The current produced by the reversed bias power supply 26 is limited primarily by a control resistor 28 that is placed between the opto-isolator 22 and the light source 12. The output of the reverse bias power supply 26 is limited to a value that is preferably less than one percent of the total current drawn by the light source 12. Accordingly, for the monitoring circuit 10 shown, the current reaching the light source 12 from the reversed bias power supply 26 is 0.003 amps or less.

The opto-isolator 22 creates an output signal. The output signal is received by a simple transistor configuration or another voltage activated switch 30, many of which are well known in the art. The voltage activated switch 30 is coupled to two indicators 32, 34. The first indicator is a functioning indicator 32 that is used to show that the lamp is in working order. The second indicator is a "not-functioning" indicator 34 that is used to show that the light source 12 is not functioning.

In operation, both the vehicle battery 14 and the reverse bias power supply 26 are powered. When the switch 16 is closed, the light source 12 is activated. The light source 12 receives approximately 99% of its required current from the vehicle battery 14 and 1% of its current from the reverse bias power supply 26 via the opto-isolator 22 and control resistor 28. In this state of normal operation, the opto-isolator 22 produces an output signal of a proper voltage to cause the voltage activated switch 30 to activate the functioning indicator 32.

If the switch 16 is open and the light source 12 is isolated from the vehicle battery 14, the lamp still receives 1% or less of its required operating current from the reverse bias power supply 26. This small flow of current is insufficient to operate the light source 12, thus the functional life of the light source 12 is not shortened. The small current from the reverse bias power supply 26 is prevented from reaching the vehicle battery 14 by both the open switch 16 and the Schottky diode 20.

Since the current produced by the reversed bias power supply 26 is still flowing through the light source 12, the output signal leaving the opto-isolator 22 remains the same. As a result, the voltage activated switch 30 lights the functioning indicator 32. It will therefore be understood that even though the light source 12 is not "on", the light source 12 is being actively monitored and a signal indicative of the lamp's functionality is being produced.

If the light source 12 fails to light for any reason, the light source 12 will not draw current from either the vehicle battery 14 or the reverse bias power supply 26. This condition statement remains true regardless of whether the primary switch 16 is switched open or closed. It is irrelevant if the primary switch 16 is switched on or off at the moment of light source failure. In either circumstance, the current from the reversed bias power supply 26 through the light source 12 stops.

When the current flow through the light source 12 stops, the current from the reversed bias power supply 26 stops. The current cannot pass to the vehicle battery 14 due to the presence of the Schottky diode 20. As a result, the current flow through the control resistor 28 and the opto-isolator 22 drops to zero. As a consequence, the output voltage of the opto-isolator 22 also drops to zero.

When the output voltage of the opto-isolator 22 drops to zero, the voltage activated switch 30 changes state and powers the "not-functioning" indicator 34 instead of the previously activated functioning indicator 32. A double change therefore occurs. The functioning indicator 32 deactivates and the "not-functioning" indicator 34 activates. This change occurs at the very moment of failure, regardless of whether the light source was on or off at the time of failure.

It should be understood that the reverse bias power supply 26 can be physically positioned remotely from the actual light source 12 and/or primary battery 14. In this manner, should a thief or terrorist try to bypass a system by disconnecting the primary battery 14, the monitoring circuit 10 will still operating and the tampering of the system can be detected at a remote location.

It will be understood that the embodiment of the present invention that is illustrated and described is merely exemplary and that a person skilled in the art can make many variations to that embodiment. All such embodiments are intended to be included within the scope of the present invention as defined by the claims.

What is claimed is:

1. A circuit for monitoring the functionality of an electrical element, said circuit comprising:
    a primary power supply;
    a Schottky diode disposed between said primary power supply and said electrical element, wherein said electrical element draws a primary current through said Schottky diode when said electrical element operates;
    a reverse bias power supply;
    an opto-isolator disposed between said reverse bias power supply and said electrical element, wherein said electrical element draws secondary current from said reverse bias power supply through said opto-isolator, and wherein said opto-isolator creates an output signal indicative of said secondary current; and
    a failure indicator triggered by said output signal when said secondary current stops.

2. The circuit according to claim 1, wherein said secondary current is approximately one percent of said primary current.

3. The circuit according to claim 1, further including at least one resistor disposed between said opto-isolator and said electrical element to limit said secondary current to no more than one percent of said primary current.

4. The circuit according to claim 1, wherein said electrical element is a light source.

5. The circuit according to claim 1, wherein said reverse bias power supply outputs a higher voltage than said primary power supply.

6. The circuit according to claim 1, wherein said primary power supply and said reverse bias power supply both output direct current.

7. The circuit according to claim 6, wherein said primary power supply is a twelve-volt vehicle battery.

8. The circuit according to claim 1, wherein said failure indicator is a light.

9. The circuit according to claim 1, further including an operational indicator that indicates said electrical element is operational as said output signal indicates that said secondary current is flowing through said electrical element.

10. A circuit for monitoring the functionality of a light element, said circuit comprising:
- a primary power supply;
- a Schottky diode disposed between said primary power supply and said light element, wherein said light element draws a primary current from said primary power supply through said Schottky diode when said light element is lit;
- a secondary power supply;
- an opto-isolator disposed between said secondary power supply and said light element, wherein said light element draws secondary current from said secondary power supply through said opto-isolator causing said opto-isolator to create an output signal indicative of said secondary current; and
- a failure indicator triggered by said output signal when said secondary current stops.

11. The circuit according to claim 10, wherein said secondary current is approximately one percent of said primary current.

12. The circuit according to claim 10, further including at least one resistor disposed between said opto-isolator and said light element to limit said secondary current to no more than one percent of said primary current.

13. The circuit according to claim 10, wherein said secondary power supply outputs a higher voltage than said primary power supply.

14. The circuit according to claim 10, wherein said primary power supply and said secondary power supply both output direct current.

15. The circuit according to claim 14, wherein said primary power supply is a twelve-volt vehicle battery.

16. The circuit according to claim 10, wherein said failure indicator is a light.

17. The circuit according to claim 10, further including an operational indicator that indicates said light element is operational as said output signal indicates that said secondary current is flowing through said light element.

18. A method of determining the functionality of an electrical light, said method comprising the steps of:
- connecting a Schottky diode in series with a primary power supply and said electrical light, wherein said electrical light draws a primary current from said primary power supply through said Schottky diode when said electrical light is lit;
- producing a trickle current by passing the output of a secondary power supply to an opto-isolator, wherein said opto-isolator produces an output signal indicative of said trickle current;
- passing said trickle current through said electrical light, wherein said trickle current is insufficient to light said electrical light; and
- monitoring said output signal for a signal stoppage, wherein said signal stoppage indicates said electrical light has failed.

19. The method according to claim 18, wherein said step of monitoring includes lighting a failure indicator when said signal stoppage occurs.

* * * * *